(12) United States Patent
Nguyen et al.

(10) Patent No.: US 8,035,163 B2
(45) Date of Patent: Oct. 11, 2011

(54) LOW-COST DOUBLE-STRUCTURE SUBSTRATES AND METHODS FOR THEIR MANUFACTURE

(75) Inventors: Bich-Yen Nguyen, Austin, TX (US); Carlos Mazure, Bernin (FR)

(73) Assignee: S.O.I.Tec Silicon on Insulator Technologies, Bernin (FR)

( * ) Notice: Subject to any disclaimer, the term of this patent is extended or adjusted under 35 U.S.C. 154(b) by 0 days.

(21) Appl. No.: 12/470,253

(22) Filed: May 21, 2009

(65) Prior Publication Data

US 2009/0321829 A1    Dec. 31, 2009

Related U.S. Application Data

(60) Provisional application No. 61/093,896, filed on Sep. 3, 2008.

(30) Foreign Application Priority Data

Jun. 30, 2008   (FR) ...................................... 08 03697

(51) Int. Cl.
*H01L 29/66* (2006.01)
*H01L 21/30* (2006.01)
*H01L 21/46* (2006.01)

(52) U.S. Cl. ............... 257/365; 257/347; 257/E29.134; 257/E21.179; 438/283; 438/458; 438/588

(58) Field of Classification Search ............... 438/455, 438/458, 283, 588, FOR. 393; 257/288, 257/289, 347, 365, E21.179, E29.129, E29.134
See application file for complete search history.

(56) References Cited

U.S. PATENT DOCUMENTS

| 4,300,150 | A |   | 11/1981 | Colak ............................. 357/23 |
| 4,771,016 | A | * | 9/1988  | Bajor et al. .................... 438/455 |
| 5,399,507 | A |   | 3/1995  | Sun .................................. 437/24 |
| 5,750,000 | A |   | 5/1998  | Yonehara et al. ........... 156/630.1 |
| 5,773,151 | A |   | 6/1998  | Begley et al. ................. 428/446 |
| 6,063,713 | A |   | 5/2000  | Doan ............................. 438/763 |
| 6,140,163 | A |   | 10/2000 | Gardner et al. ............... 438/157 |
| 6,166,411 | A |   | 12/2000 | Buynoski ....................... 257/347 |
| 6,166,412 | A | * | 12/2000 | Kim et al. ...................... 257/366 |

(Continued)

FOREIGN PATENT DOCUMENTS

DE            42 32 844 A1    3/1994

(Continued)

OTHER PUBLICATIONS

Disney, "SOI Smart IGBT with Low Cost and High Performance," IEEE International Symposium on Power Semiconductor Devices and IC's, May 1997, pp. 289-292.

(Continued)

*Primary Examiner* — Matthew Smith
*Assistant Examiner* — Quovaunda V Jefferson
(74) *Attorney, Agent, or Firm* — Winston & Strawn LLP

(57) ABSTRACT

In preferred embodiments, the invention provides substrates that include a support, a first insulating layer arranged on the support, a non-mono-crystalline semi-conducting layer arranged on the first insulating layer, a second insulating layer arranged on the non-mono-crystalline semi-conducting layer; and top layer disposed on the second insulating layer. Additionally, a first gate electrode can be formed on the top layer and a second gate electrode can be formed in the non-mono-crystalline semi-conducting layer. The invention also provides methods for manufacture of such substrates.

17 Claims, 3 Drawing Sheets

U.S. PATENT DOCUMENTS

| | | | |
|---|---|---|---|
| 6,221,732 B1 | 4/2001 | Kaneko | 438/405 |
| 6,251,754 B1 * | 6/2001 | Ohshima et al. | 438/506 |
| 6,391,744 B1 | 5/2002 | Hudak et al. | 438/459 |
| 6,534,819 B2 * | 3/2003 | Tiwari et al. | 257/314 |
| 6,538,916 B2 | 3/2003 | Ohsawa | 365/149 |
| 6,645,795 B2 | 11/2003 | Muller et al. | 438/149 |
| 6,646,307 B1 * | 11/2003 | Yu et al. | 257/347 |
| 6,664,598 B1 | 12/2003 | Dennard et al. | 257/347 |
| 6,770,507 B2 * | 8/2004 | Abe et al. | 438/64 |
| 6,812,527 B2 | 11/2004 | Dennard et al. | 257/347 |
| 6,815,296 B2 | 11/2004 | Dennard et al. | 438/283 |
| 6,826,320 B2 | 11/2004 | Deliwala | 385/14 |
| 6,946,373 B2 | 9/2005 | Agnello et al. | 438/509 |
| 6,955,971 B2 | 10/2005 | Ghyselen et al. | 438/406 |
| 7,018,873 B2 | 3/2006 | Dennard et al. | 438/149 |
| 7,089,515 B2 | 8/2006 | Hanafi et al. | 716/4 |
| 7,102,206 B2 | 9/2006 | Hidaka et al. | 257/618 |
| 7,221,038 B2 | 5/2007 | Auberton-Herve | 257/618 |
| 7,273,785 B2 | 9/2007 | Dennard et al. | 438/262 |
| 7,358,166 B2 | 4/2008 | Agnello et al. | 438/509 |
| 7,387,946 B2 | 6/2008 | Dao | 438/458 |
| 7,417,288 B2 | 8/2008 | Dennard et al. | 257/365 |
| 7,422,958 B2 | 9/2008 | Kostrzewa et al. | 438/406 |
| 7,883,990 B2 | 2/2011 | Levy et al. | 438/459 |
| 2002/0170487 A1 | 11/2002 | Zehavi et al. | 117/84 |
| 2003/0039439 A1 | 2/2003 | Deliwala | 385/30 |
| 2003/0057487 A1 | 3/2003 | Yamada et al. | 257/347 |
| 2004/0079993 A1 | 4/2004 | Ning et al. | 257/347 |
| 2004/0150067 A1 | 8/2004 | Ghyselen et al. | 257/506 |
| 2004/0171232 A1 * | 9/2004 | Cayrefourcq et al. | 438/458 |
| 2004/0256700 A1 | 12/2004 | Doris et al. | 257/627 |
| 2005/0112845 A1 | 5/2005 | Ghyselen et al. | 438/455 |
| 2005/0205930 A1 | 9/2005 | Williams | 257/347 |
| 2006/0016387 A1 | 1/2006 | Yokoyama et al. | 117/84 |
| 2006/0125013 A1 | 6/2006 | Rim | 257/351 |
| 2006/0154442 A1 | 7/2006 | de Souza et al. | 438/455 |
| 2006/0166451 A1 | 7/2006 | Raskin et al. | 438/311 |
| 2006/0264004 A1 | 11/2006 | Tong et al. | 438/455 |
| 2006/0276004 A1 * | 12/2006 | Dao | 438/455 |
| 2007/0032040 A1 | 2/2007 | Lederer | 438/455 |
| 2007/0138558 A1 | 6/2007 | Saitoh | 257/350 |
| 2007/0190681 A1 | 8/2007 | Lee et al. | 438/54 |
| 2008/0029815 A1 | 2/2008 | Chen et al. | 257/347 |
| 2008/0054352 A1 | 3/2008 | Imoto et al. | 257/330 |
| 2008/0079123 A1 | 4/2008 | Kostrzewa et al. | 257/635 |
| 2008/0105925 A1 | 5/2008 | Pae et al. | 257/347 |
| 2008/0124847 A1 | 5/2008 | Sudo | 438/152 |
| 2008/0153313 A1 | 6/2008 | Kononchuk | 438/795 |
| 2010/0127345 A1 | 5/2010 | Sanders et al. | 257/528 |

FOREIGN PATENT DOCUMENTS

| | | |
|---|---|---|
| FR | 2 906 078 A1 | 3/2008 |
| FR | 2 910 702 A1 | 6/2008 |
| JP | 08124827 | 5/1996 |
| WO | WO/2004/100268 | 11/2004 |
| WO | WO 2005/031842 A1 | 4/2005 |

OTHER PUBLICATIONS

Rajkumar et al., "Effects of Nitrogen Plasma Immersion Ion Implantation in Silicon," Engineering Thin Films with Ion Beams, Nanoscale Diagnostics, and Molecular Manufacturing, Proceedings of SPIE, vol. 4468, pp. 131-139 (2001).

Yang et al., "High Performance CMOS Fabricated on Hybrid Substrate With Different Crystal Orientations," International Electron Devices Meeting, Dec. 2003, pp. 18.7.1-18.7.3.

"Controlled, Varying Depth Etching for VIA Holes and for Variable Conductor Thickness," IBM Technical Disclosure Bulletin, 31(7): 81-82 (Dec. 1988).

International Search Report and Written Opinion of the International Searching Authority, application No. PCT/US2009/044825, Jan. 13, 2010.

Search Report of French Patent Application No. 0803697.

Maleville et al., "Multiple SOI layers by multiple Smart Cut™ transfers", IEEE International SOI Conference, pp. 134-135 (2000).

H. Nagano et al., XP009097417, "SOI/Bulk Hybrid Wafer Fabrication Process Using Selective Epitaxial Growth (SEG) Technique for High-End SoC Applications", Japanese Journal of Applied Physics, vol. 42, No. 4B, pp. 1882-1886 (2003).

International Search Report, application No. PCT/US2009/044365, Jul. 16, 2009.

International Search Report, application No. PCT/US2009/044372, Jul. 10, 2009.

International Search Report and Written Opinion of the International Searching Authority, application No. PCT/US2009/044810, Jan. 13, 2010.

Search Report of French Patent Application No. 0803701 dated Feb. 18, 2009.

Search Report of French Patent Application No. 0803696 dated Feb. 23, 2009.

French Preliminary Search Report, FA 709339, FR 0803700, dated May 11, 2009.

French Preliminary Search Report, FA 709128, FR 0803676 dated Feb. 2, 2009.

Non-Final Office Action, U.S. Appl. No. 12/470,152, dated Feb. 7, 2011.

Non-Final Office Action, U.S. Appl. No. 12/469,436, dated Jan. 25, 2011.

* cited by examiner

LOW-COST DOUBLE-STRUCTURE SUBSTRATES AND METHODS FOR THEIR MANUFACTURE

This application claims the benefit of application No. 61/093,896 filed Sep. 3, 2008, the entire content of which is expressly incorporated herein by reference thereto.

FIELD OF THE INVENTION

The present invention relates to low-cost substrates having a double-structure and to methods of manufacturing such low-cost double-structure substrates.

BACKGROUND OF THE INVENTION

Examples known double-structure substrates are described in Maleville et al., 2000, "Multiple SOI layers by multiple Smart Cut™ transfers", IEEE International SOI Conference, pp 134-135. Double-structure substrates described therein comprise, in succession, a support, a first insulating layer, a first crystalline layer, a second insulating layer and a second crystalline layer.

Such double-structure substrates are useful for the fabrication of microelectronic devices, e.g. certain CMOS transistors, having high-performance but low-power consumption. In particular, multiple gate devices can be fabricated in double-structure substrates, one gate being fabricated in the buried first crystalline layer and a second gate being fabricated on top of the second crystalline layer. In such devices, electrical potentials under the gates sources, drains and channels on the top of the second crystalline layer can be controlled by appropriate operation of gates in the buried first crystalline layer.

Devices fabricated in double-structure substrates achieve high-performance and low-power by reducing the parasitic capacitances between the gates sources and drains and their supports that are typical in traditional single-structure substrates. Such devices cannot be fabricated in traditional single-structure substrates, since they do not have the second insulating layer and the second crystalline layer.

However, the cited document teaches that manufacturing such double-structure substrates is complex, requiring sequentially performing two layer-transfer operations, one layer-transfer to form the first insulating layer and first crystalline layer and the second layer-transfer to form the second insulating layer and top crystalline layer. Although high quality stacks of crystalline layers can be manufactured, their higher costs limit or prevent their economical use in lower-cost, consumer end products mobile phones, PDAs, and the like.

SUMMARY OF THE INVENTION

The present invention provides low-cost double-structure substrates suitable for use in a wide range of applications including microelectronics, optoelectronics, photovoltaic, micro-electro-mechanical devices. The low-cost double-structure substrates of the invention can find particular use in the fabrication of high-performance, low-power devices, e.g., for computing or telecommunication devices that are embedded into mobile consumer devices. The invention also provides devices fabricated from such substrates and methods for manufacture and fabrication of these substrates and devices.

Importantly, instead of the buried mono-crystalline, semi-conducting layers found in double-structure substrates of the prior art, the double-structure substrates of this invention comprise a buried, non-mono-crystalline, semi-conducting layer. This feature, use of a non-mono-crystalline layer instead of a mono-crystalline layer, of the double-structure substrates of this invention simplifies their manufacturing and reduces their cost. The present invention therefore provides a low-cost approach to the problem of providing double-structure substrates that incorporate a non-mono-crystalline semi-conducting layer.

It is also important that the non-crystalline nature of the non-mono-crystalline semi-conducting layer of substrate can be expected to have only minor impacts on the performance and power requirement of the devices that will be formed on and in substrate. This lack of impact is because the so-called "back gate" electrodes are formed in the non-mono-crystalline semi-conducting layer and the operation of such gates do not require high quality mono-crystalline material.

More precisely, the invention provides substrates having a support, a first insulating layer arranged on the support, a non-mono-crystalline semi-conducting layer arranged on the first insulating layer, a second insulating layer arranged on the non-mono-crystalline semi-conducting layer, and a top layer disposed on the second insulating layer.

The invention provides methods of manufacturing such a substrate in which, starting from a support having a first insulating surface layer and a donor substrate having a second insulating surface layer, a non-mono-crystalline semi-conducting layer is formed on the first insulating layer and/or the second insulating layer to obtain a first structure that includes the support and a second structure that includes the donor substrate; then the first structure and the second structure are assembled together; and finally the thickness of the donor substrate of the second structure is reduced to form the final substrate.

The invention provides further methods of manufacturing a substrate in which, starting from an initial substrate, a first insulating layer is placed and/or deposited on the surface of the initial substrate; a non-mono-crystalline semi-conducting layer is placed and/or deposited on the surface of the first insulating layer; and then a second insulating layer is placed and/or deposited on the surface of the non-mono-crystalline semi-conducting layer. The resulting structure is then assembled with an additional substrate such that the first insulating layer, the non-mono-crystalline semi-conducting layer, and the second insulating layer are sandwiched between the initial substrate and the additional substrate. Finally, the thickness of the initial substrate or of the additional substrate is reduced to form the substrate.

BRIEF DESCRIPTION OF THE DRAWINGS

Other features and advantages of the invention will become apparent from the following descriptions that refer to the appended drawings, which illustrate exemplary but non-limiting embodiments of the invention, and in which:

FIGS. 3a1, 3a2, and 3b to 3e illustrate embodiments of the methods of the invention.

DETAILED DESCRIPTION OF THE PREFERRED EMBODIMENTS

The preferred embodiments and particular examples described herein should be seen as examples of the scope of the invention, but not as limiting the present invention. The scope of the present invention should be determined with reference to the claims.

Figure 1:
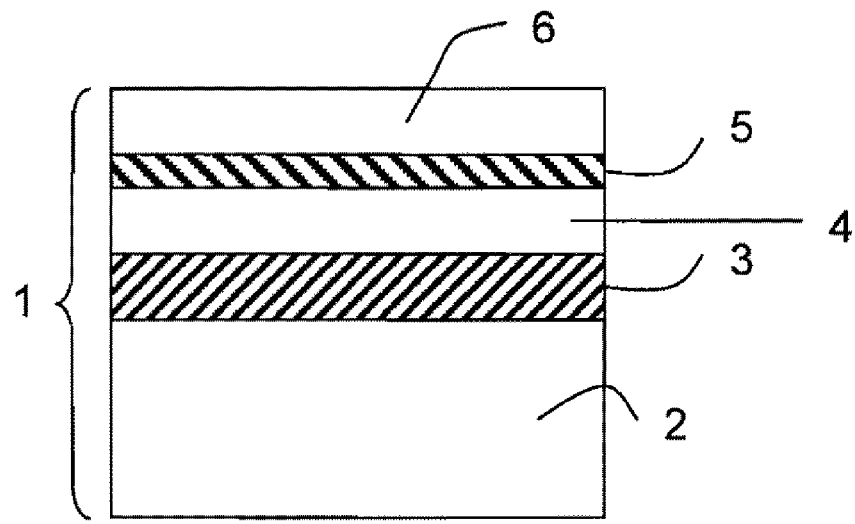
FIG. 1 illustrates embodiments of the substrates of the invention.

FIG. 1 illustrates double-structure substrate 1 of the invention. Substrate 1 includes support 2, first insulating layer 3 arranged on support 2, non-mono-crystalline semi-conducting layer 4 arranged on first insulating layer 3, second insulating layer 5 arranged on non-mono-crystalline semi-conducting layer 4, and top layer 6 disposed on second insulating layer 5.

Substrate 1 includes support 2 which can be selected from lower-cost materials, e.g., mono-crystalline silicon, or poly-crystalline silicon, or other lower cost materials, as it usually has little or no active role in substrate 1.

Substrate 1 also includes first insulating layer 3 and second insulating layer 5, which can comprise one or more insulating materials, e.g., silicon dioxide, silicon nitride, a low k dielectric i.e. a material with a dielectric constant lower than the dielectric constant of silicon dioxide, a high k dielectric i.e. a material with a dielectric constant higher than the dielectric constant of silicon dioxide, or combinations of these materials. Layers 3 and 5 can be a single layer or can be a stack of sub-layers, the sub-layers being selected from the above insulating materials. In preferred embodiments, first insulating layer 3 and second insulating layer 5 comprise silicon dioxide.

The thicknesses of layers 3 and 5 can be selected as required by the final application of the substrate. In preferred embodiments, the thickness of first insulating layer 3 is more than 50 nm and the thickness of second insulating layer 5 is less than 25 nm, e.g., 10 nm. These thicknesses are particularly advantageous as thicker insulating layer 3 reduces parasitic capacitances whereas thinner insulating layer 5 reduces back gate bias voltages.

Substrate 1 also includes non-mono-crystalline semi-conducting layer 4 having thickness sufficient to form second gate electrode 22. In preferred embodiments, semi-conducting layer 4 comprises silicon or silicon germanium with a thickness between 20 nm and 200 nm. It can be amorphous or polycrystalline, or can have both poly-crystalline regions and amorphous regions.

Substrate 1 includes top layer 6 in which channels of microelectronic devices are usually formed. Therefore, top layer 6 is preferably higher quality and/or mono-crystalline so that device performance and circuit yield are suitable. Top layer 6 can comprise one or more of silicon, strained silicon, germanium, strained germanium, strained silicon germanium, GaAs, GaN, InP, SiC, or other semiconductors. For improved device performance, top layer 6 is preferably thin, e.g., less than 100 nm, or less then 50 nm, or thinner. Microelectronic devices formed in thin top layer 6 are operated in so-called "fully depleted" or "partially depleted" modes in relation to the distribution of the electrical charge flowing in the channel and to reduce junction capacitance so that such devices can have better performance than devices formed in thicker top layers and operated in other modes.

Figure 2:
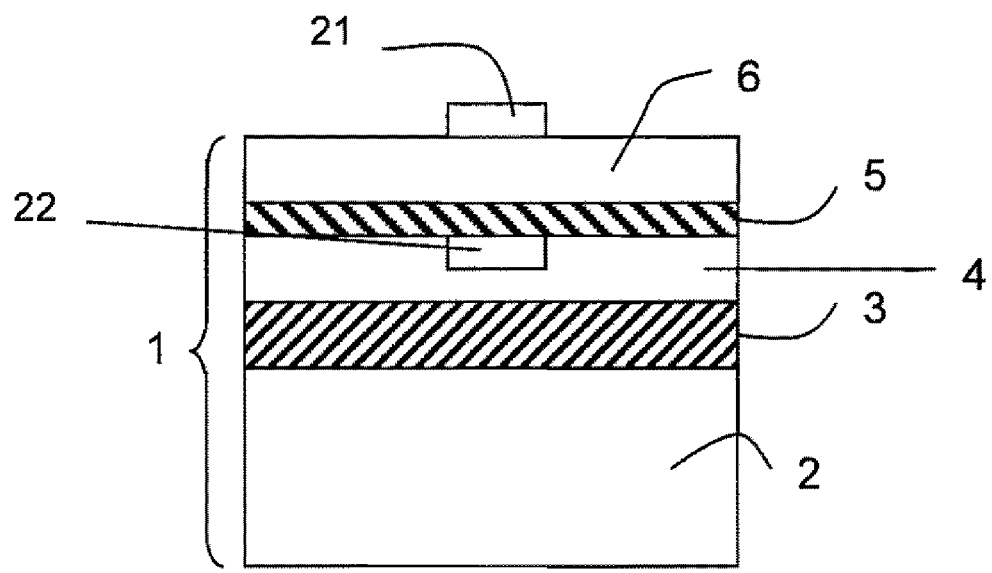
FIG. 2 illustrates embodiments of the substrates of the invention that have been further processed.

FIG. 2 illustrates an exemplary use of substrate 1. First gate electrode and gate dielectric 21 have been formed on top layer 6 in order to control a gate channel (not illustrated in this figure) arranged under the gate dielectric and electrode. Second gate electrode 22 has been formed in non-mono-crystalline e.g., amorphous or poly-crystalline, semi-conducting layer 4 in order to control and limit parasitic capacitances that usually exist between the source, drain and support.

An exemplary manufacturing process for the device of FIG. 2 begins by providing substrate 1, and forming second gate electrode 22 in non-mono-crystalline semi-conducting material layer 4 by, e.g., dopant implantation. Next, gate dielectric and first gate electrode 21 are formed on top layer 6 using known masking, depositing and etching techniques. Alternatively, first gate electrode 21 can be formed before second gate electrode 22, but this alternative is less preferably since it requires that the dopant be implanted through first gate electrode 21.

FIGS. 3a1, 3a2, and 3b to 3e illustrate an embodiment of processes for manufacturing substrates 1.

FIG. 3a1 illustrates support 2 having first insulating layer 3 preferably comprising mono-crystalline silicon.

FIG. 3a2 illustrates donor substrate 8 preferably comprising materials suitable for top layer 6, since top layer 6 ultimately derives from donor substrate 8. Accordingly, donor substrate 8 can be mono-crystalline silicon, germanium, strained silicon, or other type of semiconductor material.

First and second insulating layers 3 and 5 can be a single layer or can comprise a stack of sub-layers; the layers and the sub-layers comprise one or more of silicon dioxide, silicon nitride, a low k dielectric material, or a high k dielectric material. In preferred embodiments and where support 2 and donor 8 comprise silicon, first and second insulating layers 3 and 5 can comprise silicon dioxide that is optionally formed by thermally oxidizing silicon support 2 and/or silicon donor substrate 8, respectively.

Figure 3B:
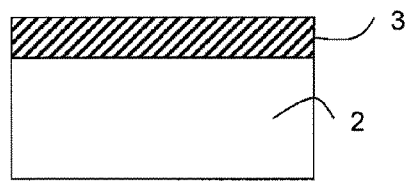
Figure 3B:
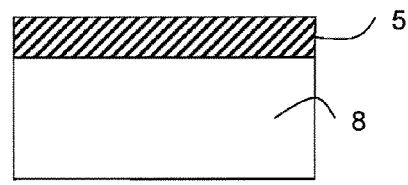
Figure 3B:
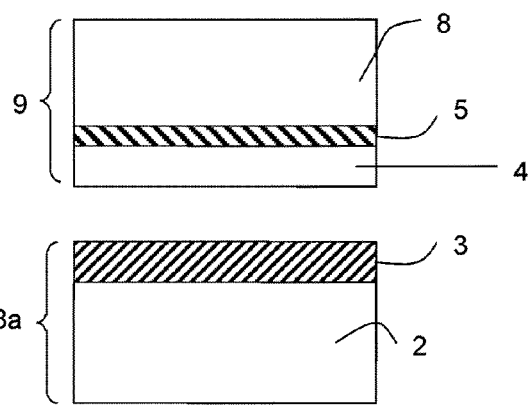
Figure 3C:
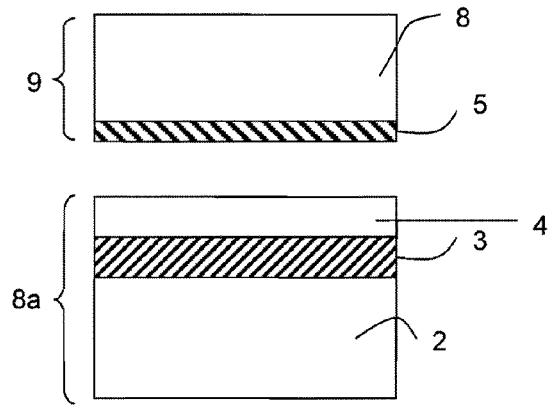

FIGS. 3b and 3c illustrate alternatives for depositing and/or placing non-mono-crystalline semi-conducting layer 4 on support 2 or on donor substrate 8 in order to form first structure 8a from support 2 or second structure 9 from donor substrate 7, respectively. Preferably, non-mono-crystalline semi-conducting layer 4 is deposited by chemical vapour deposition or physical vapour deposition of silicon or silicon germanium, in their amorphous or poly-crystalline forms.

FIG. 3b illustrates an alternative in which non-mono-crystalline semi-conducting layer 4 is deposited and/or placed on second insulating layer 5.

FIG. 3c illustrates an alternative in which non-mono-crystalline semi-conducting layer 4 is deposited and/or placed on first insulating layer 3.

Optionally, prior to the subsequent assembly of support 2 and donor substrate 8, either one or both of the exposed surfaces to be assembled can be polished. Since a poly-crystalline semi conducting layer can present a surface requiring preparation before bonding, optional polishing of such surfaces is particularly advantageous. To the extent that it is easier to obtain an amorphous non-crystalline semi-conducting surface this is ready "as deposited" for bonding, such surfaces are preferred for non-mono-crystalline semi-conducting layer 4. Optionally, prior to assembly and to further facilitate bonding during assembly, non-mono-crystalline semi-conducting layer 4 can be partially oxidized.

Figure 3D:
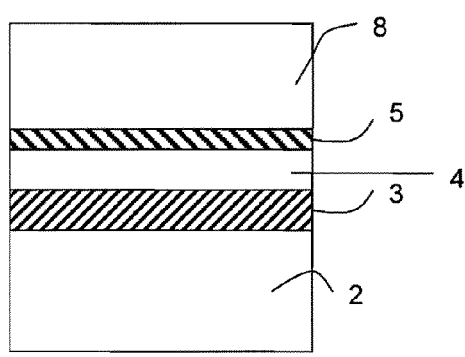

FIG. 3d illustrates assembling and bonding first structure 8a and second structure 9.

Figure 3E:
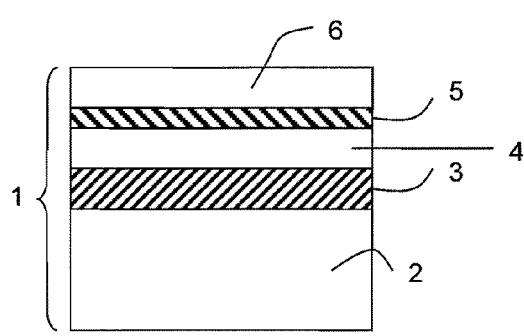

FIG. 3e illustrates that, after assembly and bonding, donor substrate 8 as part of second structure 9 is thinned to produce final substrate 1. Known thickness reducing techniques can be used for such thinning, e.g., grind and etch back, Smart Cut® employing ion implantation and layer fracture, and other techniques.

During the steps of assembling and/or reducing the thickness, it can be advantageous to apply thermal treatments. If the non-mono-crystalline semi-conducting layer 4 comprises amorphous material and if the temperature one or more thermal treatments exceeds the amorphous material's deposition temperature, some or all of originally amorphous layer 4 may re-crystallize. In such a case, layer 4 can comprise regions of poly-crystalline nature along with regions of amorphous nature. In any case, the layer remains non-mono-crystalline.

Figure 4A:
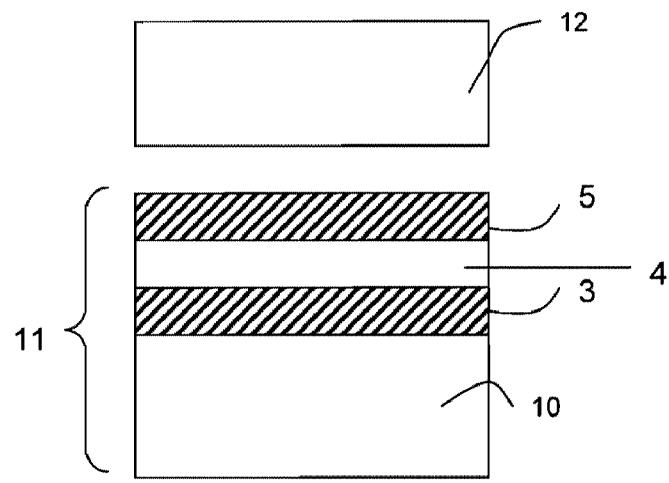
FIGS. 4a to 4c illustrate further embodiments of the methods of the invention.
Figure 4B:
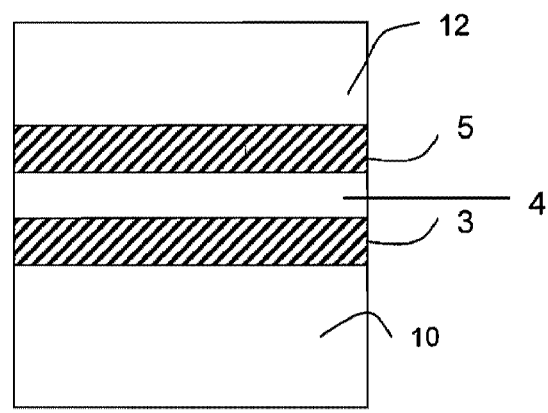
Figure 4C:
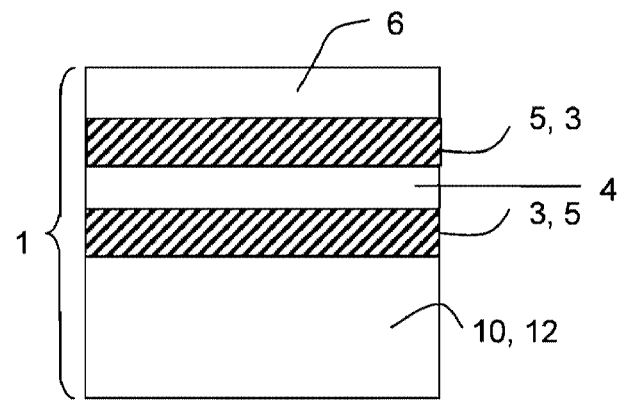

FIG. 4a to 4c illustrate another embodiment of processes for manufacturing substrates 1.

FIG. 4a illustrates resulting structure 11 and additional substrate 12. Resulting structure 11 can be formed by placing and/or depositing on initial substrate 10 first insulating layer 3, then placing and/or depositing non-mono-crystalline semi-conducting layer 4, and finally placing and/or depositing second insulating layer 5,3. Resulting structure 11, as illustrated, comprises all layers of substrate 1 except top layer 6.

Preferred compositions and thicknesses of layers 3, 4, 5 have been described above and will not be repeated here. First insulating layer 3 can be deposited or formed on initial substrate 10 by thermal oxidation; second insulating layer 5 can also be deposited on the non-mono-crystalline semi-conducting layer 4 or can be formed on layer 4 by oxidation.

FIG. 4b illustrates assembly and bonding of resulting structure 11 and additional substrate 12 such that first insulating layer 3, non-mono-crystalline semi-conducting layer 4, and second insulating layer 5 are sandwiched between initial substrate 10 and additional substrate 12. Bonding of resulting structure 11 and additional substrate 12 can optionally be facilitated by one or more further steps, e.g., additional substrate 12 can be partially oxidized or one or more of additional substrate 12 and first and second insulating layers 5, 3 can be polished.

FIG. 4c illustrates resulting substrate 1 after initial substrate 10 or additional substrate 12 has been thinned as in the previous embodiment described with respect of FIG. 3a to 3e. Since, in different embodiments, top layer 6 can originate from either of initial substrate 10 or additional substrate 12, first and second insulating layers 5, 3 can have different orientations relative to top layer 6 as illustrated in FIG. 4c.

What is claimed is:

1. A method of manufacturing a double-structure substrate which comprises:
    providing a support substrate having a first insulating surface layer with a thickness of 50 nm to 1 micron;
    providing a crystalline donor substrate;
    forming, in succession, either a non-mono-crystalline, semi-conducting intermediate layer and a second insulating layer on the support substrate, or the second insulating layer and the non-mono-crystalline intermediate layer on the donor substrate, wherein the non-mono-crystalline intermediate layer is made of a semiconductor material that is of lower crystalline quality than that of the donor substrate and has a thickness between 20 nm and 200 nm, and the second insulating layer has a thickness of less than 25 nm;
    assembling the support substrate with the donor substrate so that the intermediate layer is sandwiched between the first and second insulating layers, and the intermediate layer and the first and second insulating layers are sandwiched between the two substrates; and
    reducing the thickness of the donor substrate portion of the assembled structure to provide a remaining portion of the donor substrate having a thickness of less than 100 nm as a top layer, thus forming the double-structure substrate.

2. The method of claim 1 wherein one or both of the support and donor substrates comprise mono-crystalline silicon.

3. The method of claim 1 wherein one or both of the first and second insulating layers comprises silicon dioxide, silicon nitride, low k dielectric material, high k dielectric material, or a combination of these materials.

4. The method of claim 1 wherein the intermediate layer comprises silicon or silicon germanium.

5. The method of claim 1 wherein the intermediate layer comprises an amorphous material, or a polycrystalline material, or a combination of these materials.

6. The method of claim 1 further comprising partially oxidising the surface of the non-mono-crystalline semi-conducting layer adjacent to the second insulating layer.

7. The method of claim 1, which further comprises providing a gate electrode in the intermediate layer or in the surface of the remaining portion of the donor substrate.

8. The method of claim 7, wherein gate electrodes are provided in both the intermediate layer and the surface of the remaining portion of the donor substrate.

9. A method of manufacturing a double-structure substrate which comprises:
    providing a support substrate having a first insulating surface layer with a thickness of 50 nm to 1 micron;
    providing a crystalline donor substrate;
    forming, in succession, either a non-mono-crystalline, semi-conducting intermediate layer and a second insulating layer on the support substrate, or the second insulating layer and the non-mono-crystalline intermediate layer on the donor substrate, wherein the non-mono-crystalline intermediate layer is made of a semiconductor material that is of lower crystalline quality than that of the donor substrate and has a thickness between 20 nm and 200 nm, and the second insulating layer has a thickness of less than 25 nm;
    forming a second gate electrode in the intermediate layer;
    assembling the support substrate with the donor substrate so that the intermediate layer is sandwiched between the first and second insulating layers, and the intermediate layer and the first and second insulating layers are sandwiched between the two substrates;
    reducing the thickness of the donor substrate portion of the assembled structure to form a remaining portion having a thickness of less than 100 nm to form the double-structure substrate; and
    forming a gate dielectric and a first gate electrode on the surface of the remaining portion of the donor substrate.

10. The method of claim 9 wherein the first gate electrode is formed after the second gate electrode.

11. The method of claim 9 wherein the second gate electrode is formed by implanting dopants into the intermediate layer.

12. A double-structure substrate comprising:
    a support substrate;
    a first insulating layer arranged on the support and having a thickness between 50 nm and 1 micron;
    a non-mono-crystalline semi-conducting intermediate layer arranged on the first insulating layer, having a thickness between 20 nm and 200 nm, and comprising, alone or in combination, an amorphous material or a polycrystalline material;
    a second insulating layer arranged on the non-mono-crystalline semi-conducting layer and having a thickness less than 25 nm;
    a crystalline semiconductor top layer arranged on the second insulating layer and having a thickness less than 100 nm;
    a gate dielectric and a first gate electrode arranged on the top layer; and
    a second gate electrode arranged in the non-mono-crystalline semi-conducting layer.

13. The substrate of claim 12 wherein the support comprises mono-crystalline silicon.

14. The substrate of claim 12 wherein one or both of the first insulating layer and the second insulating layer comprise silicon dioxide, silicon nitride, low k dielectric material, a high k dielectric material, or a combination of these materials.

15. The substrate of claim 12 wherein the intermediate layer comprises silicon or silicon germanium.

16. The substrate of claim 12 wherein the top layer comprises one or more of the group consisting of silicon, strained silicon, germanium, strained germanium, strained silicon germanium, GaAs, GaN, InP, and SiC.

17. In a method of manufacturing microelectronic devices including gate electrodes supported by a double-structure substrate, the improvement which comprises:

manufacturing the double structure substrate by:

providing a support substrate having a first insulating surface layer with a thickness of 50 nm to 1 micron;

providing a crystalline donor substrate;

forming, in succession, either a non-mono-crystalline, semi-conducting intermediate layer and a second insulating layer on the support substrate, or the second insulating layer and the non-mono-crystalline intermediate layer on the donor substrate, wherein the non-mono-crystalline intermediate layer is made of a semiconductor material that is of lower crystalline quality than that of the donor substrate and has a thickness between 20 nm and 200 nm, and the second insulating layer has a thickness of less than 25 nm;

assembling the support substrate with the donor substrate so that the intermediate layer is sandwiched between the first and second insulating layers, and the intermediate layer and the first and second insulating layers are sandwiched between the two substrates; and reducing the thickness of the donor substrate portion of the assembled structure to form a remaining portion having a thickness of less than 100 nm to form the double-structure substrate;

wherein the method of manufacturing of the substrate facilitates the provision of gate electrodes in the intermediate layer, the surface of the remaining portion of the donor substrate, or in both the intermediate layer and the surface of the remaining portion of the donor substrate by reducing parasitic capacitances and back gate bias voltages.

* * * * *